(12) United States Patent
Zhai et al.

(10) Patent No.: US 10,289,171 B2
(45) Date of Patent: May 14, 2019

(54) RACK-MOUNTED SERVER

(71) Applicant: EMC IP Holding Company LLC, Hopkinton, MA (US)

(72) Inventors: Haifang Zhai, Shanghai (CN); David Wei Dong, Shanghai (CN); Hendry Xiaoping Wu, Shanghai (CN); Yujie Zhou, Shanghai (CN); Jing Chen, Epping (AU)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/460,149

(22) Filed: Mar. 15, 2017

(65) Prior Publication Data
US 2017/0269646 A1  Sep. 21, 2017

(30) Foreign Application Priority Data

Mar. 15, 2016 (CN) .......................... 2016 1 0148041

(51) Int. Cl.
| G06F 1/16 | (2006.01) |
| H05K 5/00 | (2006.01) |
| H05K 7/00 | (2006.01) |
| G06F 1/18 | (2006.01) |
| H05K 7/14 | (2006.01) |
| H05K 5/02 | (2006.01) |
| H05K 1/18 | (2006.01) |

(52) U.S. Cl.
CPC ............. *G06F 1/187* (2013.01); *H05K 1/189* (2013.01); *H05K 5/0221* (2013.01); *H05K 7/1489* (2013.01); *H05K 7/1492* (2013.01)

(58) Field of Classification Search
CPC  G06F 1/18; G06F 1/183; G06F 1/187; H05K 5/0221; H05K 7/1489; H05K 7/1492
USPC ........................ 361/679.31–679.39, 724–727
See application file for complete search history.

(56) References Cited

U.S. PATENT DOCUMENTS

| 6,922,336 | B2 * | 7/2005 | Barsun ..................... G06F 1/183 312/223.2 |
| 7,038,915 | B2 * | 5/2006 | King ..................... H05K 7/1487 312/236 |
| 7,042,721 | B2 * | 5/2006 | Olesiewicz ............. G06F 1/184 312/223.2 |
| 7,193,856 | B2 * | 3/2007 | Hidaka ................ G11B 33/126 211/190 |
| 7,394,660 | B2 * | 7/2008 | Hidaka ................ G11B 33/126 361/724 |
| 7,748,803 | B2 * | 7/2010 | Bazany ................. A47F 5/0093 108/143 |

(Continued)

*Primary Examiner* — Anthony M Haughton
(74) *Attorney, Agent, or Firm* — Krishnendu Gupta; Lesley Leonessa

(57) ABSTRACT

Embodiments of the present disclosure provide a rack-mounted server. The rack-mounted server comprises a first drive bay and a second drive bay, the first drive bay and the second drive bay include a plurality of drive slots respectively, and the second drive bay is disposed outside of the first drive bay and rotatable about the first drive bay. By adding a rotatable drive bay, embodiments of the present disclosure enable the rack-mounted server to accommodate more disks than the traditional server, thereby effectively increasing capacity and density of disks in the rack-mounted server.

11 Claims, 5 Drawing Sheets

(56) References Cited

U.S. PATENT DOCUMENTS

| | | | | |
|---|---|---|---|---|
| 8,564,946 B2* | 10/2013 | Kadri | ............ | G06F 1/187 |
| | | | | 29/592.1 |
| 9,265,173 B1* | 2/2016 | Jhang | ............ | G06F 1/187 |
| 2002/0181197 A1* | 12/2002 | Huang | ............ | G11B 33/126 |
| | | | | 361/679.33 |
| 2006/0010456 A1* | 1/2006 | Ishimine | ............ | G11B 33/128 |
| | | | | 720/600 |
| 2015/0271943 A1* | 9/2015 | Peng | ............ | G11B 33/128 |
| | | | | 361/679.39 |

* cited by examiner

RACK-MOUNTED SERVER

RELATED APPLICATIONS

This application claim priority from Chinese Patent Application Number CN201610148041.4, filed on Mar. 15, 2016 at the State Intellectual Property Office, China, titled "RACK-MOUNTED SERVER," the contents of which is herein incorporated by reference in its entirety.

FIELD

Embodiments of the present disclosure generally relate to a rack-mounted server, and more specifically, to a rack-mounted server having a plurality of drive bays.

BACKGROUND

Servers are special purpose computers that are capable of providing services centralized computing, information storage and data management and so on. Servers may be mainly classified into three types from perspective of structure: the tower type server, the rack-mounted server, and the blade server. The rack-mounted server is an upstanding server with an optimized structure, and the space occupied by this server may be reduced. The rack-mounted server usually has a width of 19 inches, and its height is in unit of U, that is, 1 U=1.75 inches=44.45 mm.

The rack-mounted server generally comprises a drive bay, and the drive bay includes a row of drive slots that can accommodate a plurality of disks. For example, a commonly-used 2 U rack-mounted server may include 24 drive slots, and a standard 2.5-inch disk may be inserted in each slot.

SUMMARY

Embodiments of the present disclosure provide a rack-mounted server that can accommodate more disks by adding a rotatable drive bay, thereby effectively increasing capacity and density of disks in the rack-mounted server.

According to an aspect of the present disclosure, there is provided a rack-mounted server. The rack-mounted server comprises a first drive bay including a plurality of drive slots and a second drive bay including a plurality of drive slots, and the second drive bay is disposed outside of the first drive bay and rotatable about the first drive bay.

In an embodiment, the plurality of drive slots in the first drive bay may be identical in quantity with the plurality of drive slots in the second drive bay. In another embodiment, the second drive bay may be rotatable about the first drive bay by 90 degrees.

In an embodiment, the rack-mounted server may further comprise a latch, the latch is disposed on a chassis of the rack-mounted server and used to fix the second drive bay to be outside of the first drive bay. In another embodiment, the rack-mounted server may further comprise a first mounting ear and a second mounting ear that are disposed on the chassis, and the first mounting ear, the second mounting ear and the plurality of disk sots in the first drive bay may form a U-shaped opening that is used to accommodate the second drive bay.

In an embodiment, the rack-mounted server may further comprise a first drive backplate and a second drive backplate, the first drive backplate is disposed in the first drive bay and includes a plurality of connection interfaces for interfacing with disks; while the second drive backplate is disposed in the second drive bay and include a plurality of connection interfaces for interfacing with disks. In another embodiment, the rack-mounted server may further comprise a hinge disposed on the first drive bay and used to rotate the second drive bay.

In another embodiment, the rack-mounted server may further comprise a plurality of input-output (I/O) interfaces, and the I/O interfaces are disposed on a side of the rack-mounted server opposite to the second drive bay. In another embodiment, the rack-mounted server may be any of 1 U server, 2 U server, 3 U server, 4 U server, 5 U server and 7 U server. In a further embodiment, a plurality of drive slots in the first drive bay are exposed to enable one or more disks to be inserted and/or extracted if the second drive bay is rotated.

BRIEF DESCRIPTION OF THE DRAWINGS

Features, advantages and other aspects of embodiments of the present disclosure will be made more apparent in combination with figures and with reference to the following detailed description. Several embodiments of the present disclosure are illustrated here in an exemplary and unrestrictive manner, wherein identical reference signs are used through the figures and represent identical elements. In the figures.

DETAILED DESCRIPTION OF EMBODIMENTS

Exemplary embodiments of the present disclosure will be described in detail with reference to figures. It should be appreciated that these exemplary embodiments are only used to enable those skilled in the art to better understand and implement embodiments of the present disclosure, not to limit the scope of the present disclosure in any manner.

Figure 1:
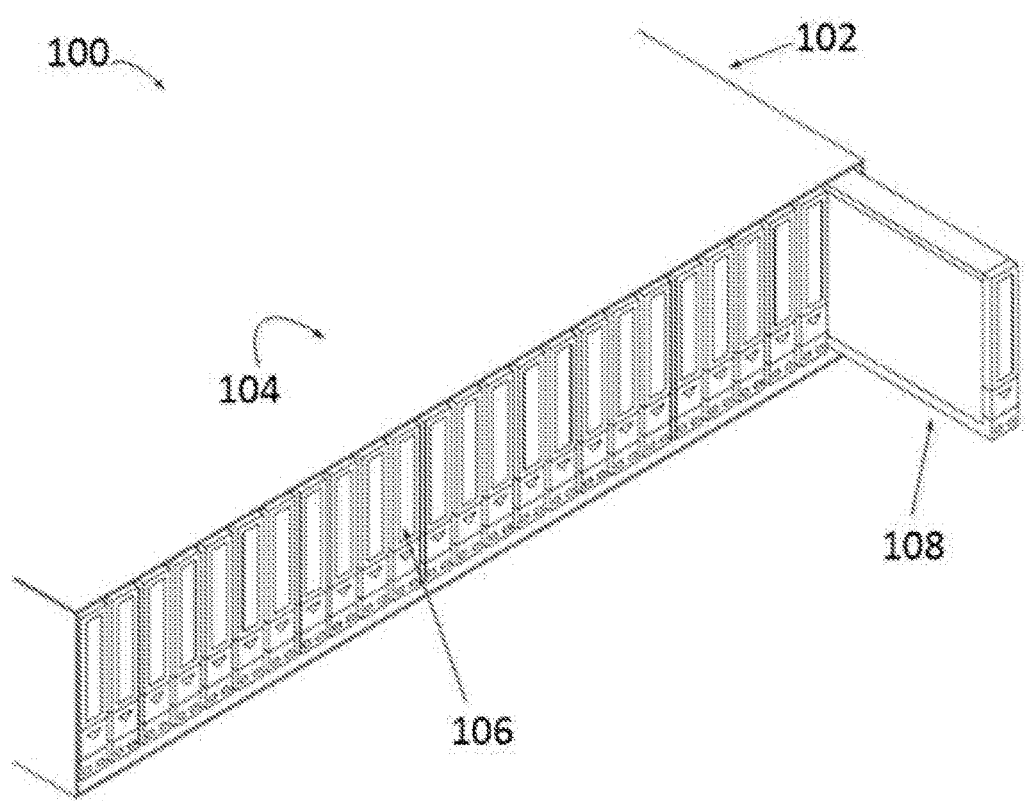
FIG. 1 is a schematic diagram of a structure of a rack-mounted server in the prior art.

FIG. 1 is a schematic diagram of a structure of a rack-mounted server 100 in the prior art. Referring to FIG. 1, the rack-mounted server 100 comprises a chassis 102 whose one side is provided with a drive bay 104. The drive bay 104 comprises a row of drive slots 106, and one or more disk 108 may be inserted into the drive slots 106. In the rack-mounted server 100 shown in FIG. 1, the drive slots 106 can accommodate up to 24 disks such as 2.5-inch disks. As shown in FIG. 1, since the rack-mounted server 100 only includes a row of 24 drive slots, it can merely accommodate a limited maximum number (e.g., only 24) of disks and cannot meet requirements for a larger disk density.

Figure 2:
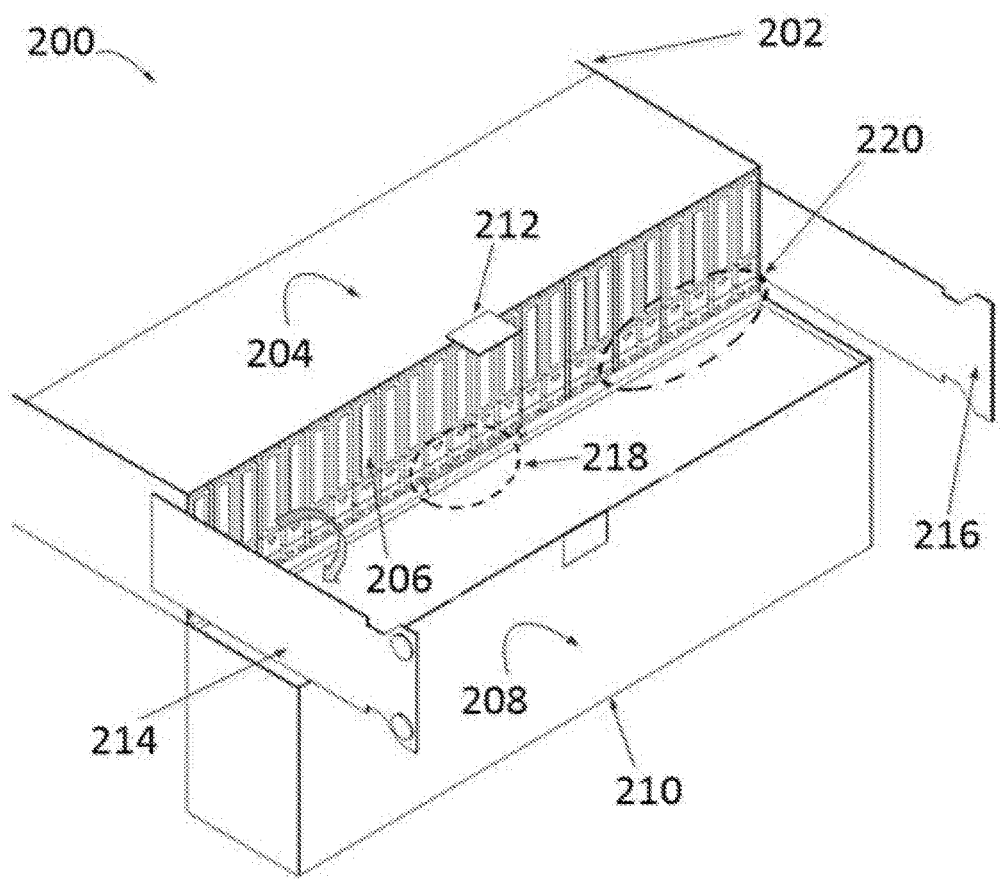
FIG. 2 is a schematic diagram of a structure of a rack-mounted server according to embodiments of the present disclosure.
Figure 3:
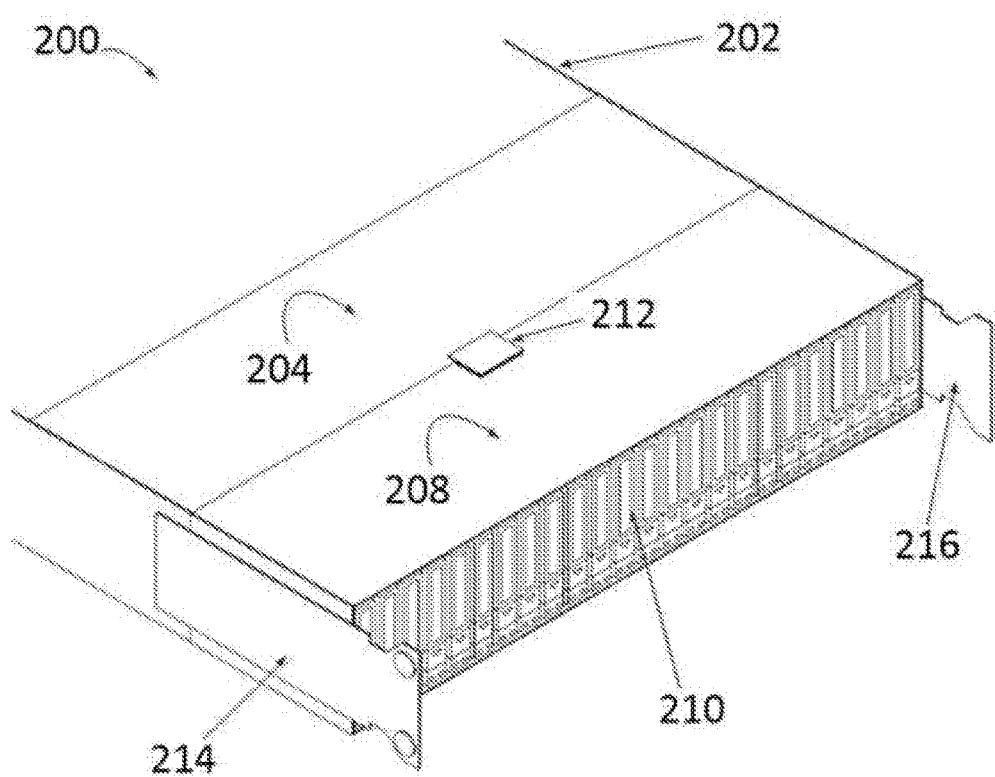
FIG. 3 is another schematic diagram of the structure of the rack-mounted server according to embodiments of the present disclosure.

FIG. 2 and FIG. 3 are schematic diagrams of a structure of a rack-mounted server 200 according to embodiments of the present disclosure. As shown in FIG. 2, the rack-mounted server 200 comprises a chassis 202, wherein one side of the rack-mounted server 200 (for example, the chassis 202) is provided with two drive bays consisting of a first and second drive bay, that is a fixed drive bay 204 and a rotatable drive bay 208. For example, as shown in FIG. 2, the drive bay 208 is disposed outside of the drive bay 204. In some embodiments the other side of the chassis 202 (for example, the side close to the drive bay 208) may be provided with a plurality of input-output (I/O) interfaces (not shown) for inputting and outputting signals.

In some embodiments, the rack-mounted server 200 may be any of 1 U server, 2 U server, 3 U server, 4 U server, 5 U server and 7 U server, wherein 1 U=1.75 inches=44.45 mm. That is to say, the height of the rack-mounted server 200 may be 1 U, 2 U, 3 U, 4 U, 5 U or 7 U. For example, if the rack-mounted server 200 is a 2 U server, it has a width of 19 inches and a height of 2 U, for example, 3.5 inches. The thickness of the rack-mounted server 200 is not precisely limited, and it may be generally limited to be less than a threshold (for example 1 meter).

The drive bay 204 may comprise a plurality of drive slots 206, and the drive bay 208 may also comprise a plurality of drive slots 210 (as shown in FIG. 3), and the drive slot represent one or more slots capable of accommodating an array of disks. In some embodiments, the number of the drive slots 206 may be same as that of the drive slots 210, for example 24, which means that the drive slots 206 and drive slots 210 may both accommodate 24 disks, such as 2.5-inch disks. Alternatively, the number of the drive slots 206 may be different from that of the drive slots 210, for example 24. For example, the drive slots 206 may accommodate 24 disks such as 2.5-inch disks, while the drive slots 210 may accommodate 16 disks such as 3.5-inch disks. Accordingly, in the exemplary rack-mounted server 200 of the present disclosure, there are provided two drive bays 204 and 208, which can effectively increase the total number of disks (for example hard disks) that can be accommodated in the rack-mounted server 200, e.g., the number of disks accommodated in the rack-mounted server is increased from 24 to 48.

In some embodiments, the disks accommodated in the rack-mounted server 200 may be various types of disks, including but not limited to, SATA disk, SAS disk, SCSI disk, IDE disk or solid-state disk. The disk interface may be any interface for connecting the disks, including but not limited to, SATA interface, PCI-E interface, SAS interface, SCSI interface, IEEE 1394a interface and IEEE 1394b interface and so on.

Continuing to refer to FIG. 2, the chive bay 204 is fixed while the drive bay 208 is rotatable. For example, the drive bay 208 may be rotatable about the drive bay 204, such as, rotating upward, downward, leftward or rightward about the drive bay 204. Optionally, the drive bay 208 may rotate clockwise or counter-clockwise by a certain angle, such as 90 degrees, 180 degrees or any degrees between 90 degrees and 180 degrees.

In some embodiments, the rack-mounted server 200 further comprises a hinge 220 that may be disposed on the drive bay 204 and used to rotate the drive bay 208. FIG. 3 shows a structure before the drive bay 208 is rotated. Alternatively or additionally, the chassis 202 is provided with a latch 212 through which the drive bay 208 may be fixed to the outside of the drive bay 204. FIG. 2 shows a structure after the drive bay 208 is rotated. At this time, the latch 212 is opened, and a plurality of drive slots 206 in the drive bay 204 are exposed so that one or more disk can be inserted and/or extracted in the drive bay 204.

In some embodiments, the rack-mounted server 200 may comprise a first mounting ear 214 and a second mounting ear 216, and the mounting ear 214 and mounting ear 216 are disposed on the chassis 202. As shown in FIG. 2, the mounting ear 214, mounting ear 216 and the plurality of disk slots 206 of the drive bay 204 may form a U-shaped opening, and the U-shaped opening may be used to accommodate the drive bay 208. When the rack-mounted server 200 operates normally, the drive bay 208 is fixed in the U-shaped opening. In some embodiments, the first mounting ear 214 and second mounting ear 216 may be provided with a plurality of holes for further fixing the drive bay 208.

In some embodiments, the drive bay 204 comprises a row of drive backplates which include a plurality of connection interfaces for interfacing with disks in the drive slots 206, and the drive bay 208 also comprises a row of drive backplates which include a plurality of connection interfaces for interfacing with disks in the drive slots 206. In some embodiments, the row of drive backplates in the drive bay 208 may be connected to the row of drive backplates in the drive bay 204 via signal lines.

In some embodiments, the rack-mounted server 200 may comprise a flexible printed circuit (FPC) 218, and the drive bay 208 may be coupled to the drive bay 204 via the FPC 218. In some embodiments, the FPC 218 may be used to transmit a SAS or SATA signal, and the FPC 218 may be arranged close to the hinge 220. In some embodiments, the FPC may have a bent structure, and a covering film is disposed at the bent structure of the FPC.

In some embodiments, the rack-mounted server 200 may further comprise an externally-connected direct current (DC) power supply (not shown) that is disposed outside of the chassis 202 and used to power the drive bay 204 and drive bay 208 in the rack-mounted server 200. In some embodiments, the chassis 2022 includes a set of fans (not shown) which may be disposed on a bottom plate of the chassis 202. In some embodiments, the rack-mounted server 200 further comprises a motherboard (not shown) which may be connected with the drive backplates in the drive bay 204 and drive backplates in the drive bay 208 via the signal lines.

Figure 4:
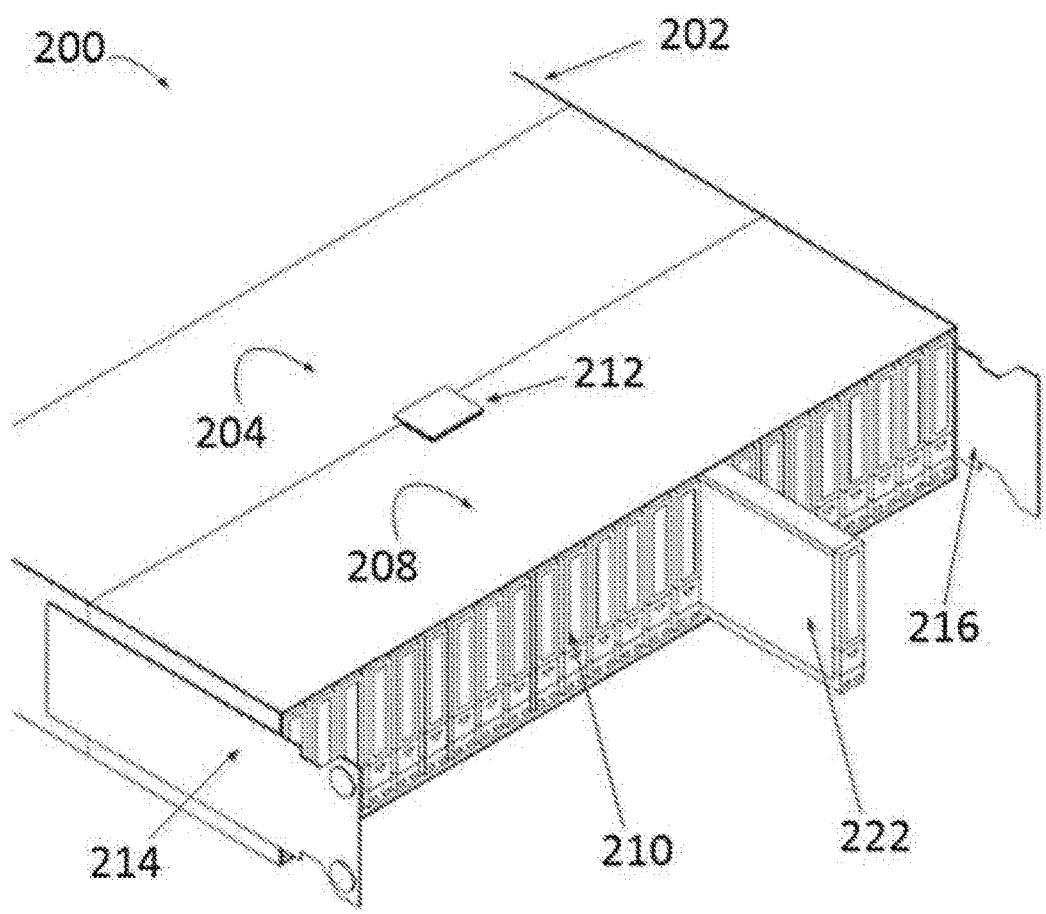
FIG. 4 is a schematic diagram for inserting or extracting a disk in the rack-mounted server according to embodiments of the present disclosure.
Figure 5:
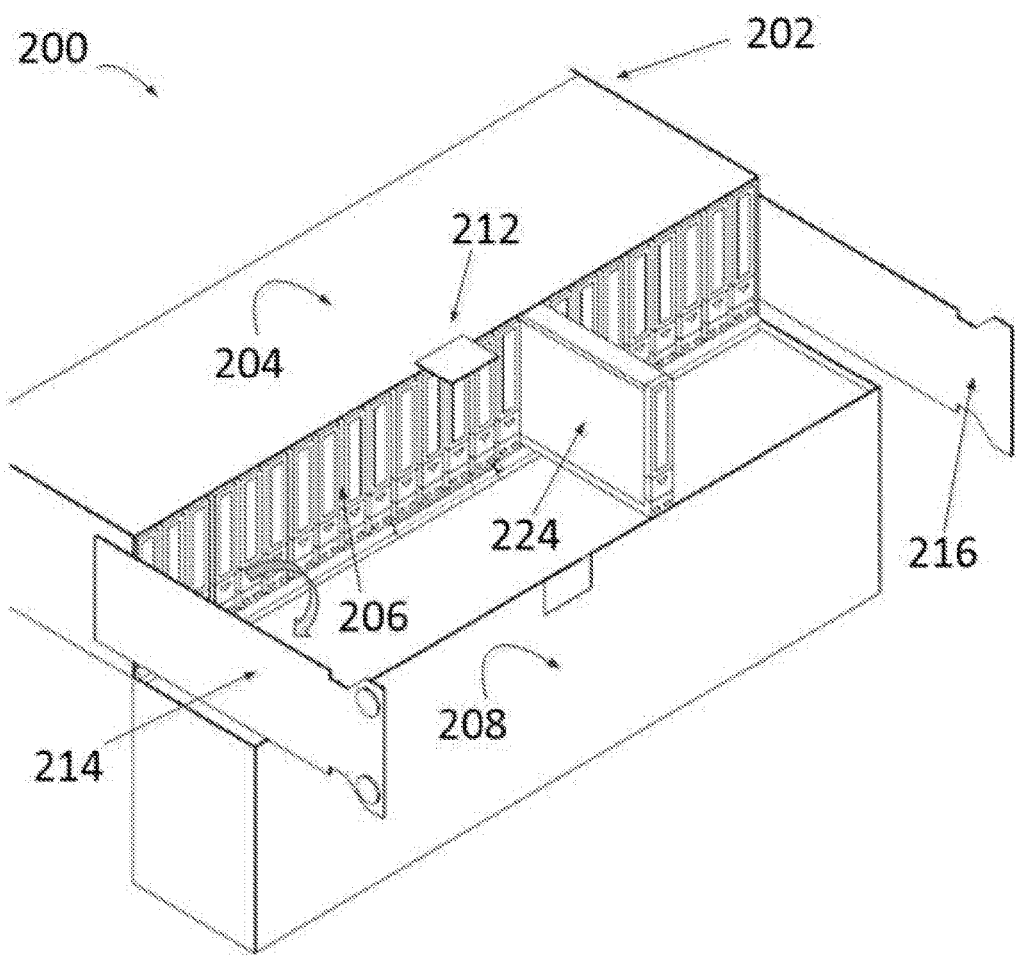
FIG. 5 is another schematic diagram of inserting or extracting a disk in the rack-mounted server according to embodiments of the present disclosure.

FIG. 4 and FIG. 5 are schematic diagrams of inserting or extracting a disk in the rack-mounted server 200 according to embodiments of the present disclosure. FIG. 4 is a schematic diagram of inserting or extracting a disk when the drive bay 208 shown in FIG. 2 or FIG. 3 is not rotated, and FIG. 5 is a schematic diagram of inserting or extracting disk when the drive bay 208 shown in FIG. 2 or FIG. 3 has already been rotated. Referring to FIG. 4 and FIG. 5, a disk may be inserted into or extracted from the drive bay 208 at any time, while a disk can be inserted into or extracted from the drive bay 204 only after the drive bay 208 is rotated.

As shown in FIG. 4, if the drive bay 208 is not rotated, the drive bay 208 is fixed through the latch 212 at the U-shaped opening formed by the two mounting ears 212, 216 and the plurality of drive slots 206. At this time, the plurality of drive slots 210 in the drive bay 208 are exposed, while the plurality of drive slots 206 in the drive bay 204 are blocked. As such, a disk (such as a hard disk 222) may be inserted into and/or extracted from the drive bay 208, while no disk can be inserted into or extracted from the drive bay 204 at this time.

As shown in FIG. 5, if the drive bay 208 has already been rotated, the plurality of drive slots 206 of the drive bay 204 are exposed, at this time, one or more disks (such as a hard disk 224) may be inserted and/or extracted in the drive bay 204. At the same time, since the drive bay 208 may be coupled to the drive bay 204 for example via the FPC 218, one or more disks in the drive bay 208 may still operate normally in a case that the drive bay 208 has already been rotated. That is to say, no matter whether the drive bay 208 is rotated, one or more disks may be inserted into or extracted from the drive bay 208, thereby achieving uninterrupted work of the rack-mounted server 200.

Accordingly, by increasing a rotatable drive bay 208, embodiments of the present disclosure enable the rack-mounted server to accommodate more disks (for example the number of disks accommodated in the rack-mounted search 200 is increased from 24 to 48), thereby effectively increasing capacity and density of disks in the rack-mounted server 200. Meanwhile, the increased rotatable drive bay 208 does not affect the depth of the rack-mounted server seriously, for example, the depth only increases by about 4 inches. Therefore, the rack-mounted server according to embodiments of the present disclosure may still be adapted for current server racks.

What are described above are only preferred embodiments of the present disclosure and not intended to limit embodiments of the present disclosure. Those skilled in the art appreciate that embodiments of the present disclosure may have various modifications and variations. Any modifications, equivalent substitutions and improvements made within the spirit and principle of embodiments of the present disclosure all should be included in the protection scope of embodiments of the present disclosure.

Although the present invention has been depicted with reference to a plurality of embodiments, it should be understood that the present invention is not limited to the disclosed embodiments. The present invention intends to cover various modifications and equivalent arrangements included in the spirit and scope of the appended claims. The scope of the appended claims meets the broadest explanations and covers all such modifications and equivalent structures and functions.

We claim:

1. A rack-mounted server, comprising:
    a first drive bay including a plurality of drive slots; and
    a second drive bay including a plurality of drive slots, the second drive bay being disposed outside of the first drive bay and being rotatable about the first drive bay using a hinge disposed lengthwise on the first drive bay, wherein, when the second drive bay is in a closed position, (i) the second drive bay is substantially adjacent to the first drive bay, (ii) the plurality of drive slots of the second drive bay are blocked, and (iii) the plurality of drive slots of the first drive bay are exposed, and when the second drive bay is in an open position, (i) the plurality of drive slots of the second drive bay are open, and (ii) the plurality of drive slots of the first drive bay are blocked.

2. The rack-mounted server according to claim 1, wherein the plurality of drive slots in the first drive bay is identical in quantity with the plurality of drive slots in the second drive bay.

3. The rack-mounted server according to claim 1, wherein the second drive bay is rotatable about the first drive bay by 90 degrees.

4. The rack-mounted server according to claim 1, wherein the rack-mounted server further comprises: a latch disposed on a chassis of the rack-mounted server and used to fix the second drive bay to outside of the first drive bay.

5. The rack-mounted server according to claim 4, further comprising: a first and second mounting ears disposed on the chassis, the first mounting ear, the second mounting ear and the plurality of drive slots in the first drive bay forming a U-shaped opening which is used to accommodate the second drive bay.

6. The rack-mounted server according to claim 1, further comprising:
    a first drive backplate disposed in the first drive bay, including a plurality of connection interfaces for interfacing with disks; and
    a second drive backplate disposed in the second drive bay, including a plurality of connection interfaces for interfacing with disks.

7. The rack-mounted server according to claim 6, further comprising: a flexible printed circuit (FPC), the second drive bay being coupled to the first drive bay via the FPC.

8. The rack-mounted server according to claim 7, wherein the hinge disposed on the first drive bay is used to rotate the second drive bay.

9. The rack-mounted server according to claim 1, further comprising: a plurality of input-output (I/O) interfaces disposed on a side of the rack-mounted server opposite to the second drive bay.

10. The rack-mounted server according to claim 1, wherein the rack-mounted server is any of 1 U server, 2 U server, 3 U server, 4 U server, 5 U server and 7 U server.

11. The rack-mounted server according to claim 1, wherein the plurality of drive slots in the first drive bay are exposed to enable one or more disks to be inserted or extracted if the second drive bay is rotated.

* * * * *